United States Patent
Chiu et al.

(10) Patent No.: US 10,847,637 B2
(45) Date of Patent: Nov. 24, 2020

(54) SEMICONDUCTOR DEVICE AND METHOD

(71) Applicant: Taiwan Semiconductor Manufacturing Company, Ltd., Hsinchu (TW)

(72) Inventors: Shih-Hang Chiu, Taichung (TW); Chung-Chiang Wu, Taichung (TW); Chia-Ching Lee, New Taipei (TW); Da-Yuan Lee, Jhubei (TW); Ching-Hwanq Su, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/397,859

(22) Filed: Apr. 29, 2019

(65) Prior Publication Data
US 2019/0259861 A1 Aug. 22, 2019

Related U.S. Application Data

(63) Continuation of application No. 15/705,034, filed on Sep. 14, 2017, now Pat. No. 10,276,690.
(Continued)

(51) Int. Cl.
*H01L 29/00* (2006.01)
*H01L 29/66* (2006.01)
*H01L 21/3065* (2006.01)
*H01L 21/28* (2006.01)
*H01L 21/225* (2006.01)
(Continued)

(52) U.S. Cl.
CPC ...... *H01L 29/66795* (2013.01); *H01L 21/225* (2013.01); *H01L 21/28088* (2013.01); *H01L 21/28176* (2013.01); *H01L 21/28185* (2013.01); *H01L 21/3065* (2013.01); *H01L 29/4966* (2013.01); *H01L 29/517* (2013.01); *H01L 29/66492* (2013.01); *H01L 29/66545* (2013.01); *H01L 21/31053* (2013.01); *H01L 21/76224* (2013.01); *H01L 29/165* (2013.01); *H01L 29/665* (2013.01); *H01L 29/6656* (2013.01); *H01L 29/7848* (2013.01)

(58) Field of Classification Search
CPC .......................... H01L 21/225; H01L 29/165
See application file for complete search history.

(56) References Cited

U.S. PATENT DOCUMENTS 6,191,463 B1 2/2001 Mitani et al.
8,487,378 B2 7/2013 Goto et al.
(Continued)

FOREIGN PATENT DOCUMENTS

EP 3244447 A1 11/2017
KR 100312918 A 1/2002
KR 20140051602 A 5/2014

*Primary Examiner* — Caridad Everhart
*Assistant Examiner* — Ankush K Singal
(74) *Attorney, Agent, or Firm* — Slater Matsil, LLP

(57) ABSTRACT

A method includes forming a dummy gate structure over a semiconductor fin, forming a dielectric layer on opposing sides of the dummy gate structure, and removing the dummy gate structure to form a recess in the dielectric layer. The method further includes forming a gate dielectric layer and at least one conductive layer successively over sidewalls and a bottom of the recess, and treating the gate dielectric layer and the at least one conductive layer with a chemical containing fluoride (F).

20 Claims, 21 Drawing Sheets

Related U.S. Application Data

(60) Provisional application No. 62/539,214, filed on Jul. 31, 2017.

(51) Int. Cl.
  *H01L 29/51* (2006.01)
  *H01L 29/49* (2006.01)
  *H01L 21/762* (2006.01)
  *H01L 21/3105* (2006.01)
  *H01L 29/78* (2006.01)
  *H01L 29/165* (2006.01)

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,887,106 B2 | 11/2014 | Ho et al. |
| 9,812,358 B1 | 11/2017 | Huang et al. |
| 2008/0054361 A1* | 3/2008 | Siprak ............... H01L 21/845 257/365 |
| 2014/0077313 A1* | 3/2014 | Li ................... H01L 21/28185 257/410 |
| 2014/0113443 A1 | 4/2014 | Won et al. |
| 2014/0282326 A1 | 9/2014 | Chen et al. |
| 2015/0035079 A1 | 2/2015 | Xie |
| 2015/0303057 A1 | 10/2015 | Lee et al. |
| 2015/0364574 A1 | 12/2015 | Kim et al. |
| 2016/0035861 A1* | 2/2016 | Park ................ H01L 21/0206 438/301 |
| 2016/0071980 A1* | 3/2016 | Chang .............. H01L 29/6656 257/410 |
| 2016/0225871 A1* | 8/2016 | Cheng ............ H01L 21/823842 |
| 2017/0032972 A1 | 2/2017 | Tsai et al. |
| 2017/0092644 A1 | 3/2017 | Cheng et al. |
| 2017/0092779 A1 | 3/2017 | Kimura et al. |
| 2017/0110551 A1 | 4/2017 | Lee et al. |
| 2017/0117191 A1 | 4/2017 | Zhou |
| 2017/0148686 A1 | 5/2017 | Bao et al. |
| 2017/0162575 A1* | 6/2017 | Li ................... H01L 21/28088 |
| 2017/0222026 A1 | 8/2017 | Chen et al. |
| 2018/0145149 A1* | 5/2018 | Chiang ............ H01L 21/3115 |

* cited by examiner

SEMICONDUCTOR DEVICE AND METHOD

PRIORITY CLAIM AND CROSS-REFERENCE

This application is a continuation of U.S. application Ser. No. 15/705,034, filed on Sep. 14, 2017, and entitled "Semiconductor Device and Method," which claims priority to U.S. Provisional Application No. 62/539,214, filed on Jul. 31, 2017 and entitled "Semiconductor Device and Method," which applications are hereby incorporated by reference herein as if reproduced in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

Figure 1:
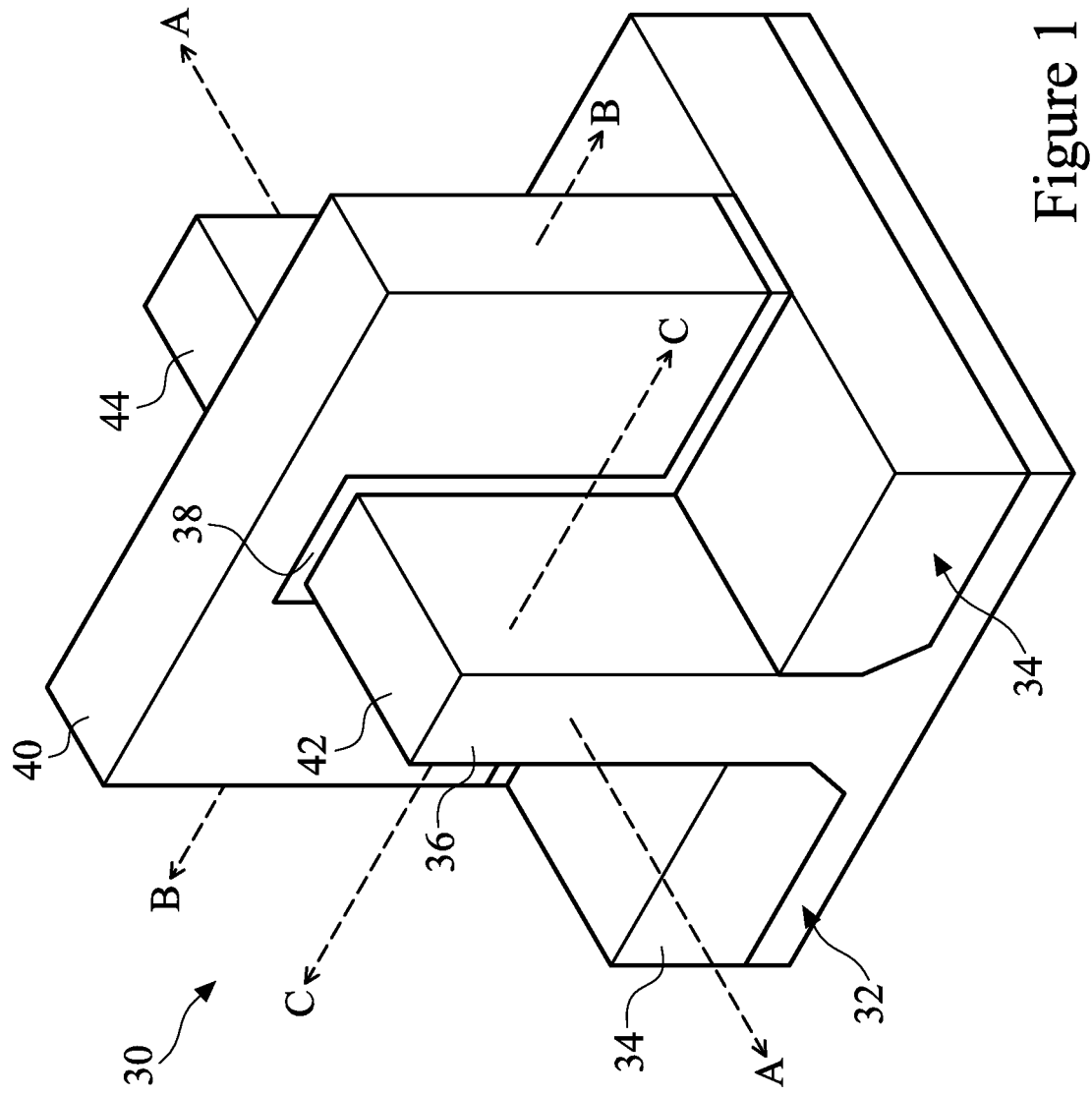
FIG. 1 is a perspective view of a Fin Field-Effect Transistor (FinFET)

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device, and in particular, in the context of improving the reliability of the gate oxide of FinFET devices. However, one skilled in the art will readily appreciate that the methods disclosed in the present disclosure may be used in other devices or applications, e.g., planar devices.

FIG. 1 illustrates an example of a FinFET 30 in a perspective view. The FinFET 30 includes a substrate 32 having a fin 36. The substrate 32 has isolation regions 34 formed thereon, and the fin 36 protrudes above and between neighboring isolation regions 34. A gate dielectric 38 is along sidewalls and over a top surface of the fin 36, and a gate electrode 40 is over the gate dielectric 38. Source/drain regions 42 and 44 are in the fin on opposite sides of the gate dielectric 38 and gate electrode 40. FIG. 1 further illustrates reference cross-sections that are used in later figures. Cross-section B-B extends along a longitudinal axis of the gate electrode 40 of the FinFET 30. Cross-section C-C is parallel to cross-section B-B and is across a source/drain region 42. Cross-section A-A is perpendicular to cross-section B-B and is along a longitudinal axis of the fin 36 and in a direction of, for example, a current flow between the source/drain regions 42 and 44. Subsequent figures refer to these reference cross-sections for clarity.

FIGS. 2-20 are cross-sectional views of a FinFET device 100 at various stages of fabrication in accordance with some embodiments. The FinFET device 100 is similar to the FinFET 30 in FIG. 1, except for multiple fins. FIGS. 2-5 illustrate cross-section views of FinFET device 100 along cross-section B-B, and FIGS. 6-20 illustrate cross-section views along cross-section A-A.

Figure 2:
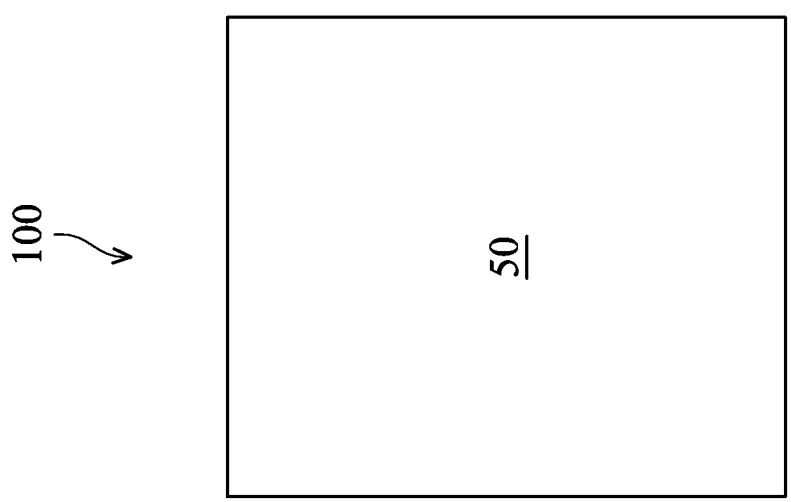
FIGS. 2-20 are cross-sectional views of a FinFET device at various stages of fabrication, in some embodiments.

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

Figure 3:
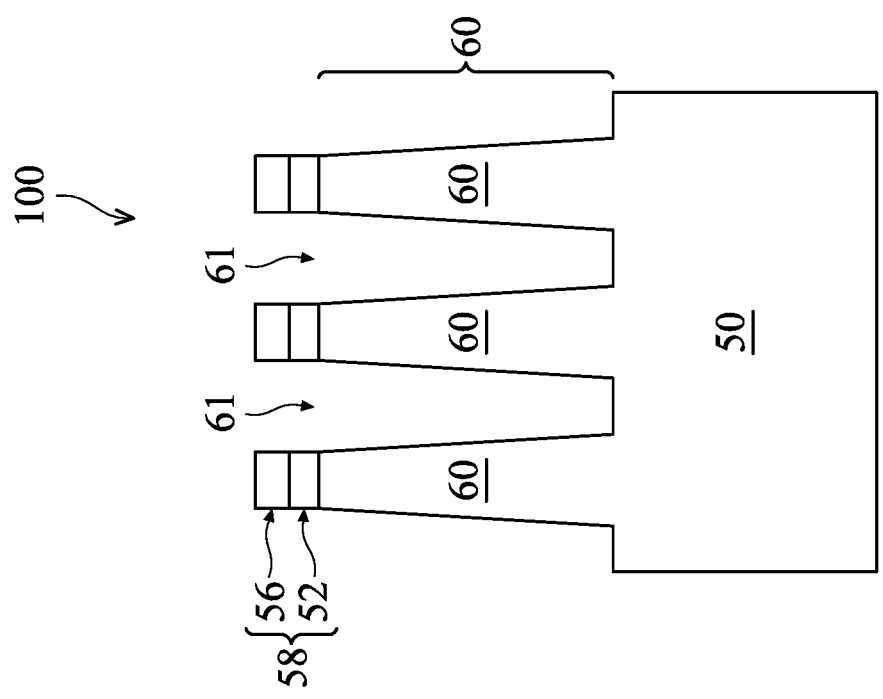

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride 56 to form a patterned mask 58, as illustrated in FIG. 3.

The patterned mask 58 is subsequently used to pattern exposed portions of the substrate 50 to form trenches 61, thereby defining semiconductor strips 60 between adjacent trenches 61 as illustrated in FIG. 3. In some embodiments, the semiconductor strips 60 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor strips 60. After semiconductor strips 60 are formed, the patterned mask layer 58 may be removed by etching or any suitable method.

Figure 4:
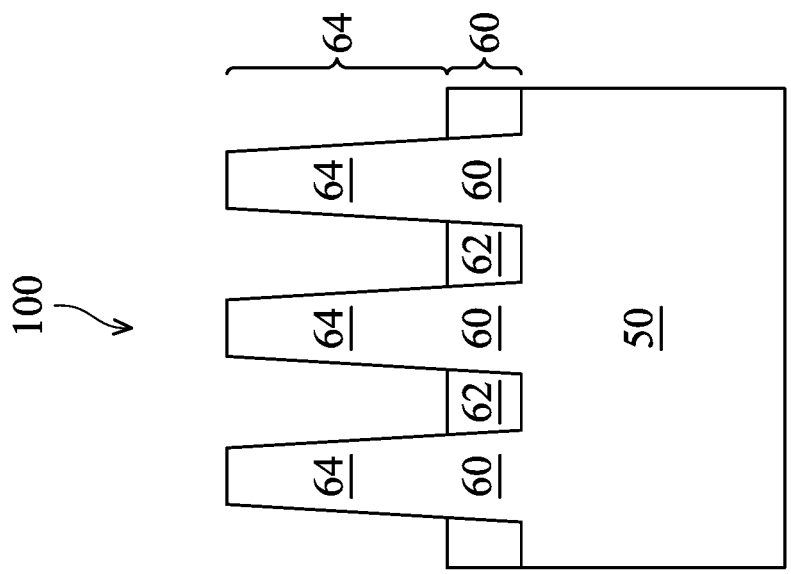

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material (and, if present, the patterned mask layer 58) and form top surfaces of the isolation regions 62 and top surfaces of the semiconductor strips 60 that are coplanar (not shown).

In some embodiments, the isolation regions 62 include a liner, e.g., a liner oxide (not shown), at the interface between the isolation region 62 and the substrate 50/semiconductor strip 60. In some embodiments, the liner oxide is formed to reduce crystalline defects at the interface between the substrate 50 and the isolation region 62. Similarly, the liner oxide may also be used to reduce crystalline defects at the interface between the semiconductor strip 60 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor strips 60 protrude from between neighboring isolation regions 62 and form semiconductor fins 64 (also referred to as fins 64). The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor strips can be recessed, and a material different from the semiconductor strips may be epitaxially grown in their place.

In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
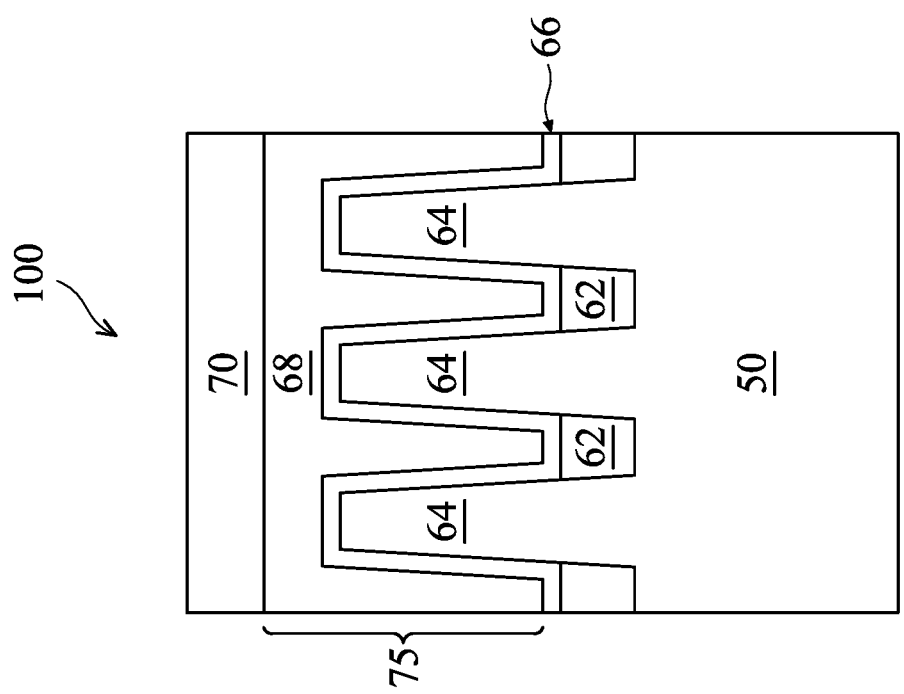

FIG. 5 illustrates the formation of dummy gate structure 75 over the semiconductor fins 64. Dummy gate structure 75 includes gate dielectric 66 and gate 68, in some embodiments. Dummy gate structure 75 may further include mask 70. To form the dummy gate structure 75, a dielectric layer 66 is formed on the semiconductor fins 64 and the isolation regions 62. The dielectric layer 66 may be, for example, silicon oxide, silicon nitride, multilayers thereof, or the like, and may be deposited or thermally grown according to acceptable techniques. In some embodiments, the dielectric layer 66 may be a high-k dielectric material, and in these embodiments, the dielectric layer 66 may have a k value greater than about 7.0, and may include a metal oxide or a silicate of Hf, Al, Zr, La, Mg, Ba, Ti, Pb, multilayers thereof, and combinations thereof. The formation methods of dielectric layer 66 may include molecular-beam deposition (MBD), atomic layer deposition (ALD), plasma-enhanced CVD (PECVD), and the like.

A gate layer 68 is formed over the dielectric layer 66, and a mask layer 70 is formed over the gate layer 68. The gate layer 68 may be deposited over the dielectric layer 66 and then planarized, such as by a CMP. The mask layer 70 may be deposited over the gate layer 68. The gate layer 68 may be formed of, for example, polysilicon, although other materials may also be used. In some embodiments, the gate layer 68 may include a metal-containing material such as TiN, TaN, TaC, Co, Ru, Al, combinations thereof, or multilayers thereof. The mask layer 70 may be formed of, for example, silicon nitride or the like.

After the layers (e.g., 66, 68 and 70) are formed, the mask layer 70 may be patterned using acceptable photolithography and etching techniques to form mask 70. The pattern of the mask 70 then may be transferred to the gate layer 68 and the dielectric layer 66 by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

Figure 6:
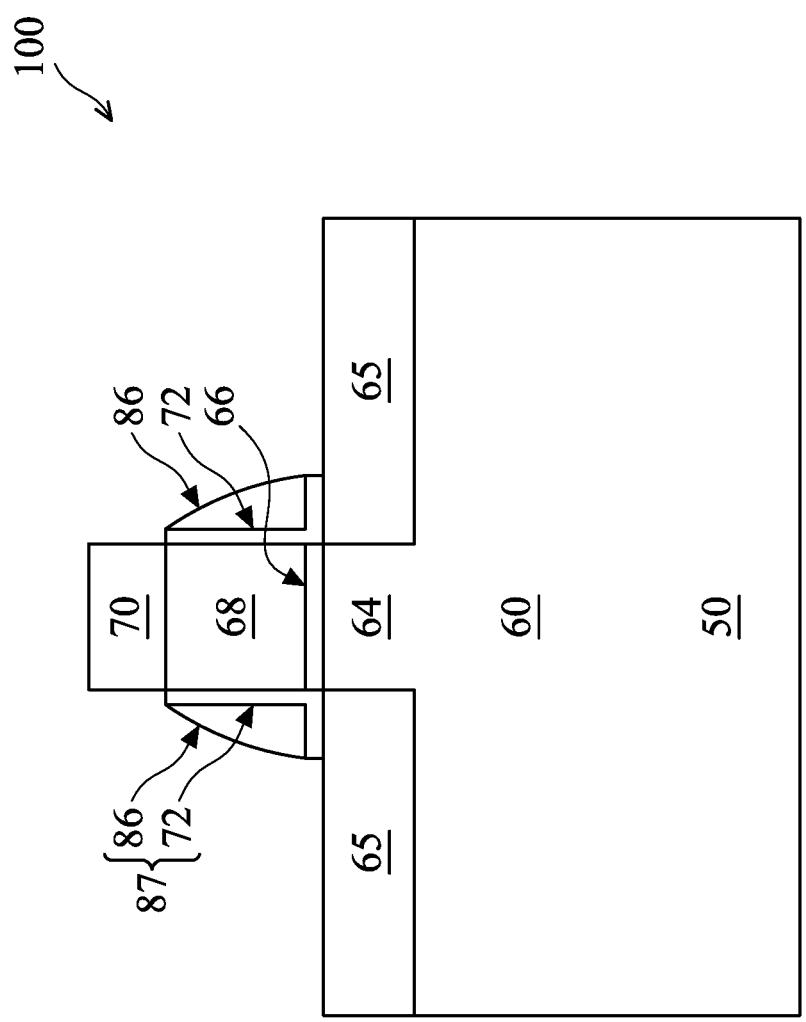

FIGS. 6-20 illustrate the cross-section views of further processing of the FinFET device 100 along cross-section A-A (along a longitudinal axis of the fin). As illustrated in FIG. 6, lightly doped drain (LDD) regions 65 are formed in the fins 64. LDD regions 65 may be formed by a plasma doping process. The plasma doping process may implant N-type or P-type impurities in the fins 64 to form the LDD regions 65. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after first gate spacers 72 are formed.

Still referring to FIG. 6, after the LDD regions 65 are formed, a gate spacer 87 is formed on the gate structure. The gate spacer 87 may include a first gate spacer 72 and a second gate spacer 86. In the example of FIG. 6, the first gate spacer 72 is formed on opposing sidewalls of the gate 68 and on opposing sidewalls of the gate dielectric 66. The first gate spacer 72 may also extend over the upper surface of the semiconductor fin 64 and the upper surface of the isolation region 62 (see FIG. 5). The second gate spacer 86 is formed on the first gate spacer 72, as illustrated in FIG. 6. The first gate spacer 72 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The second gate spacer 86 may be formed of silicon nitride, SiCN, a combination thereof, or the like using a suitable deposition method.

In an exemplary embodiment, the gate spacer 87 is formed by first conformally depositing a first gate spacer layer 72 over the FinFET device 100, then conformally depositing a second gate spacer layer 86 over the deposited first gate spacer layer 72. In the present disclosure, conformal (or conformally) means conformal (or conformally) within process variation, as one skilled in the art appreciates. For example, horizontal portions and vertical portions of the conformal first gate spacer layer 72 may have substantially the same thickness, with the vertical thickness of the vertical portions and the horizontal thickness of the horizontal portions having a difference smaller than, e.g., 20 percent of the horizontal thickness. Next, an anisotropic etch process, such as a dry etch process, is performed to remove a first portion of the second gate spacer layer 86 disposed on upper surfaces of the FinFET device 100 (e.g., the upper surface of semiconductor fins 64) while keeping a second portion of the second gate spacer layer 86 disposed along sidewalls of the gate structure. The second portion of the second gate spacer layer 86 remaining after the anisotropic etch process forms the second gate spacer 86. The anisotropic etch process also removes a portion of the first gate spacer layer 72 disposed outside of the sidewalls of the second gate spacer 86, and the remaining portion of the first gate spacer layer 72 forms the first gate spacer 72.

The shapes and formation methods of the first gate spacer 72 and the second gate spacer 86 as illustrated in FIG. 6 are merely non-limiting examples, and other shapes and formation methods are possible. For example, the second gate spacers 86 may be formed after the epitaxial source/drain regions 80 (see FIG. 7) are formed. In some embodiments, dummy gate spacers are formed on the first gate spacer 72 before the epitaxial process of the epitaxial source/drain regions 80 illustrated in FIG. 7 and the dummy gate spacers are removed and replaced with the second gate spacers 86 after the epitaxial source/drain regions 80 are formed.

Figure 7:
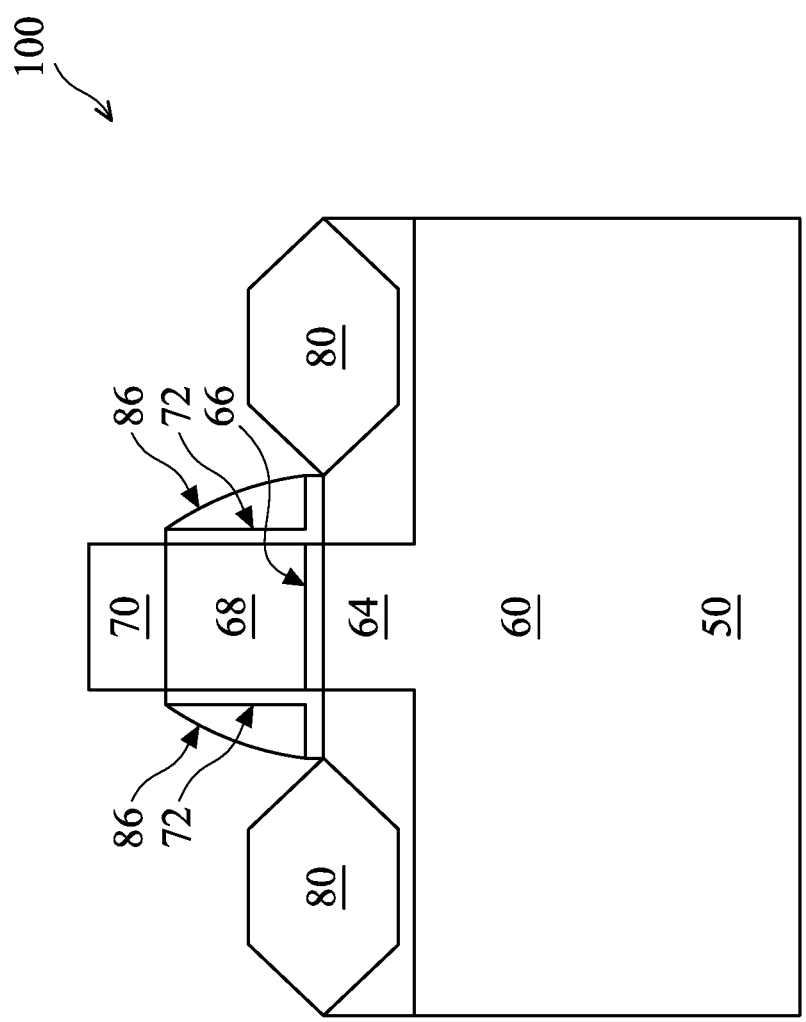

Next, as illustrated in FIG. 7, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. After the epitaxial growth of the source/drain regions 80, mask 70 may be removed by a suitable method, such as etching.

As illustrated in FIG. 7, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. In some embodiments, the source/drain regions 80 for adjacent fins 64 do not merge together and remain separate source/drain regions 80. In some exemplary embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal. The implanting process may include forming and patterning masks such as a photoresist to cover the regions of the FinFET that are to be protected from the implanting process. The source/drain regions 80 may have an impurity (e.g., dopant) concentration in a range from about 1E19 cm-3 to about 1E21 cm-3. In some embodiments, the epitaxial source/drain regions may be in situ doped during growth.

Figure 8:
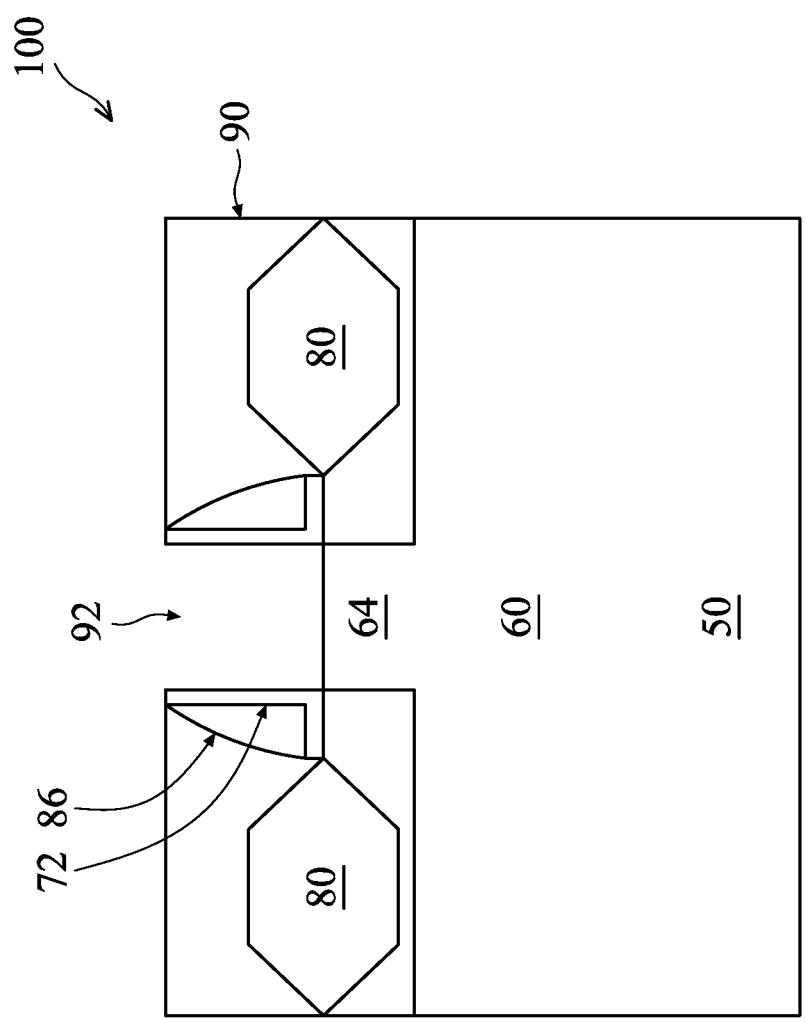

Next, as illustrated in FIG. 8, a first interlayer dielectric (ILD) 90 is formed over the structure illustrated in FIG. 7, and a gate-last process (sometimes referred to as replacement gate process) is performed. In a gate-last process, the gate 68 and the gate dielectric 66 (see FIG. 7) are considered dummy structures and are removed and replaced with an active gate and active gate dielectric, which may be collectively referred to as a replacement gate.

In some embodiments, the first ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to planarize the top surface of the first ILD 90 such that the top surface of the first ILD 90 is level with the top surface of the gate 68 (see FIG. 7). Therefore, after the CMP process, the top surface of the gate 68 is exposed, in some embodiments.

In accordance with some embodiments, the gate 68 and the gate dielectric 66 directly under the gate 68 are removed in an etching step(s), so that recesses 92 are formed in each of the fins 64. Each recess exposes a channel region of a respective fin 64. Each channel region is disposed between neighboring pairs of epitaxial source/drain regions 80. During the dummy gate removal, the dummy gate dielectric layer 66 may be used as an etch stop layer when the dummy gate 68 is etched. The dummy gate dielectric layer 66 may then be removed after the removal of the dummy gate 68.

Figure 9:
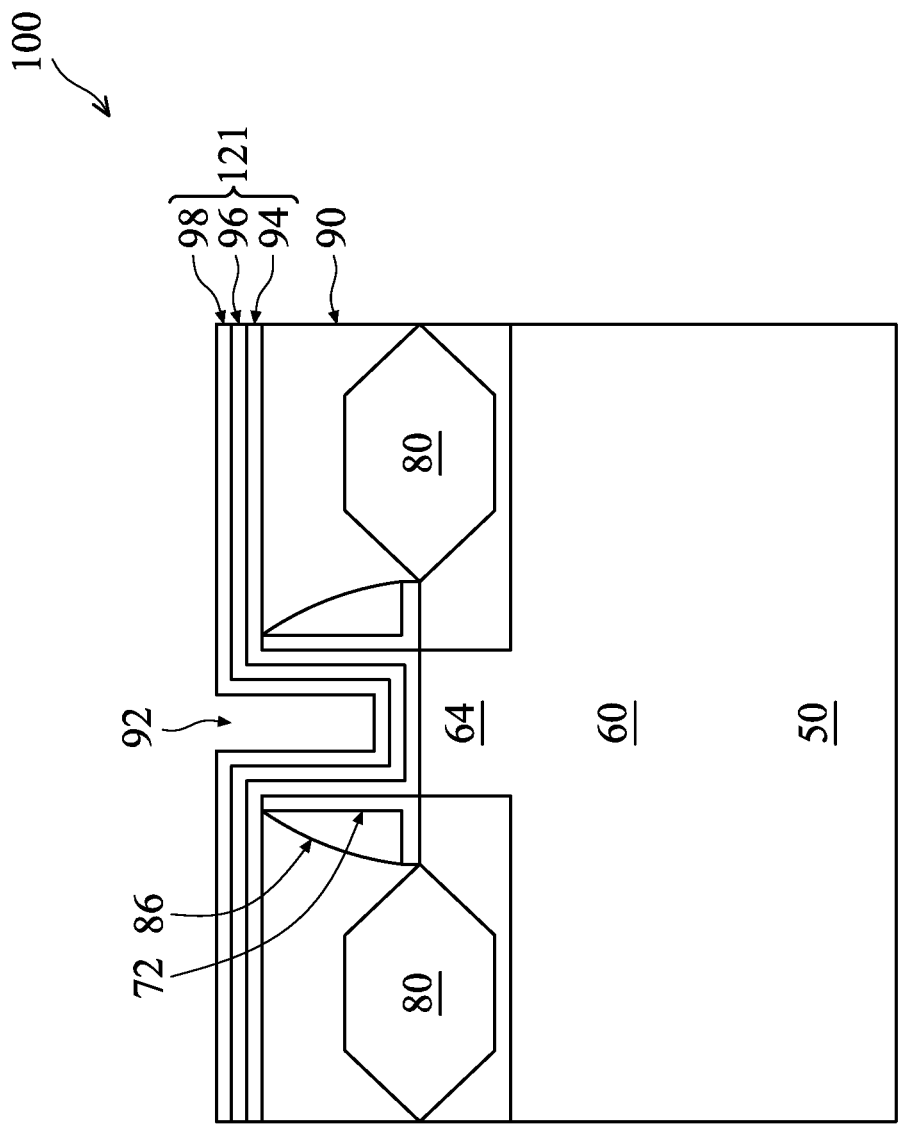

Next, in FIG. 9, a gate dielectric layer 94, a capping layer 96, and a barrier layer 98 are successively formed over semiconductor device 100. As illustrated in FIG. 9, the gate dielectric layer 94 is deposited conformally in the recess 92 and over a top surface of the first ILD 90. The capping layer 96 and the barrier layer 98 are formed conformally over the gate dielectric layer 94, with the capping layer 96 between the gate dielectric layer 94 and the barrier layer 98. The capping layer 96 may act as a work function layer of the FinFET device 100, and the barrier layer 98 may act as an etch stop layer of FinFET device 100. The gate dielectric layer 94, the capping layer 96, and the barrier layer 98 may be collectively referred to as a layer stack 121 hereinafter.

In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include MBD, ALD, PECVD, and the like. In an exemplary embodiment, the gate dielectric layer 94 is a high-K dielectric material comprising $HfO_2$, and is formed by a suitable method such as ALD. In some embodiments, the gate dielectric layer 94 is a high-k dielectric material, and a layer of silicon oxide (e.g., $SiO_2$) is formed between the gate dielectric layer 94 and the fin 64. The layer of silicon oxide may be formed by oxidization of the material of the fin 64 or by any suitable deposition method such as CVD, PVD, or ALD.

Next, the capping layer 96 is formed conformally over the gate dielectric layer 94. The capping layer comprises any suitable material for a work function layer. Exemplary p-type work function metals that may be included in the gate structure 97 (see FIG. 13) include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure 97 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a target threshold voltage Vt is achieved in the device that is to be formed in the respective region. The work function layer(s) may be deposited by CVD, PVD, ALD, and/or other suitable process.

Next, the barrier layer 98 is formed conformally over the capping layer 96. The barrier layer 98 may comprise an electrically conductive material such as titanium nitride, although other materials, such as tantalum nitride, titanium, tantalum, or the like, may alternatively be utilized. The barrier layer 98 may be formed using a CVD process, such as PECVD. However, other alternative processes, such as sputtering or MOCVD, ALD, may alternatively be used. The barrier layer 98 and the capping layer 96 comprise different materials to provide etch selectivity between the barrier layer 98 and the capping layer 96, in some embodiments. In an exemplary embodiment, the capping layer 96 comprises TiN and the barrier layer comprises TaN, and suitable deposition methods, such as ALD, may be used to form the capping layer 96 and the barrier layer 98.

Figure 10:
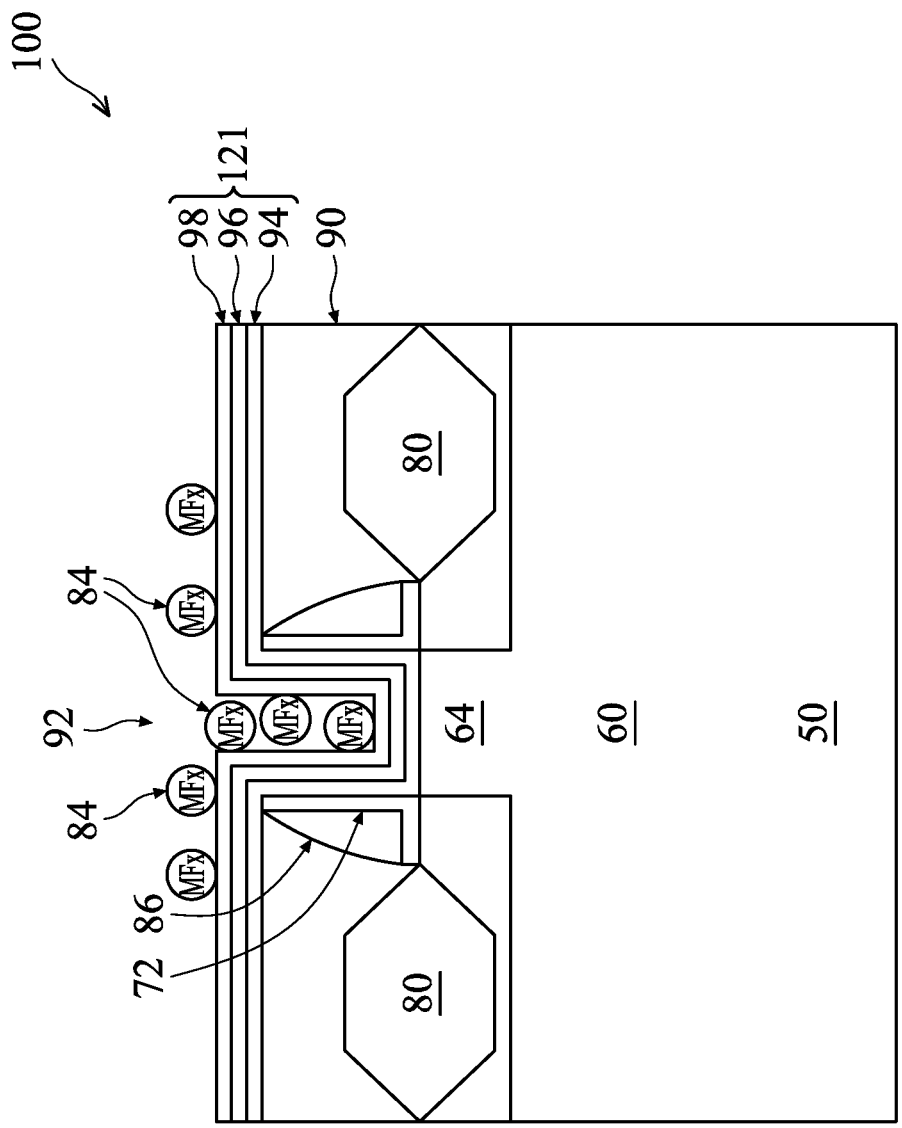
Figure 11:
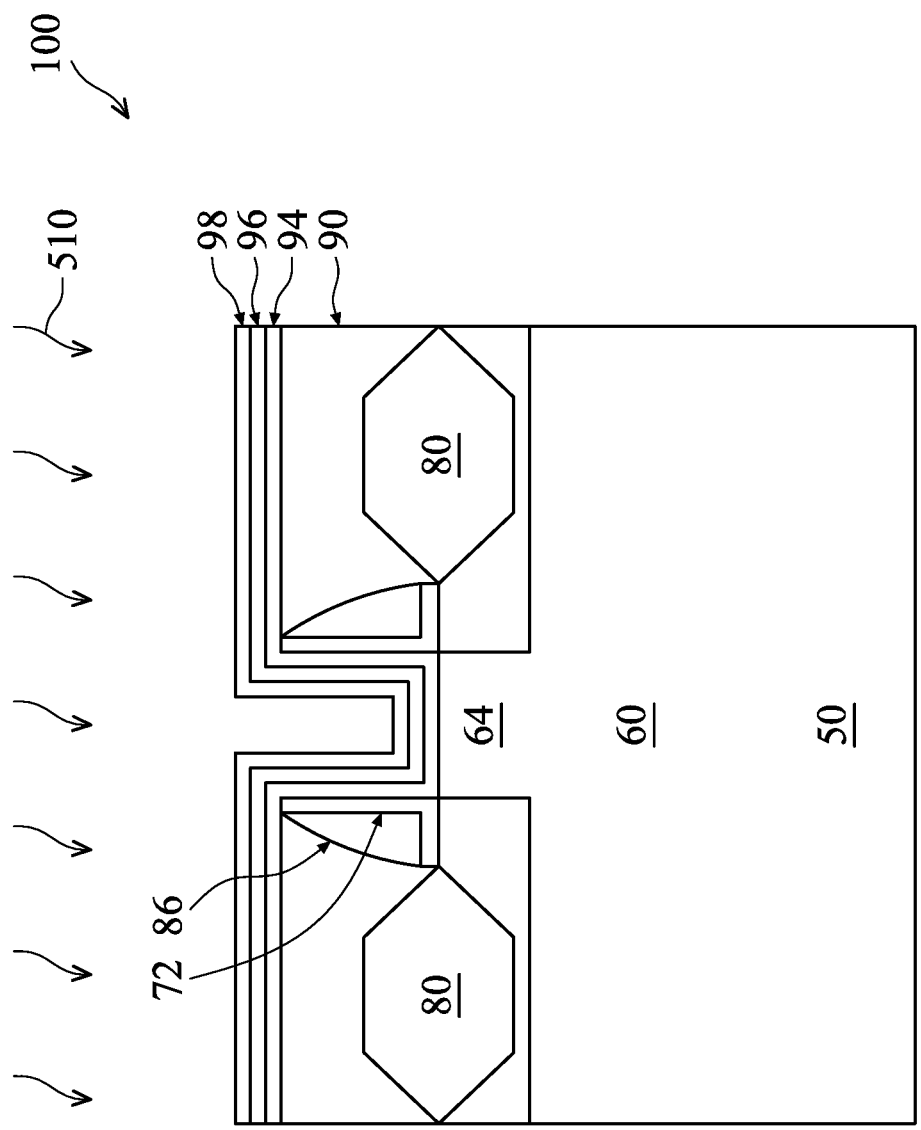
Figure 12:
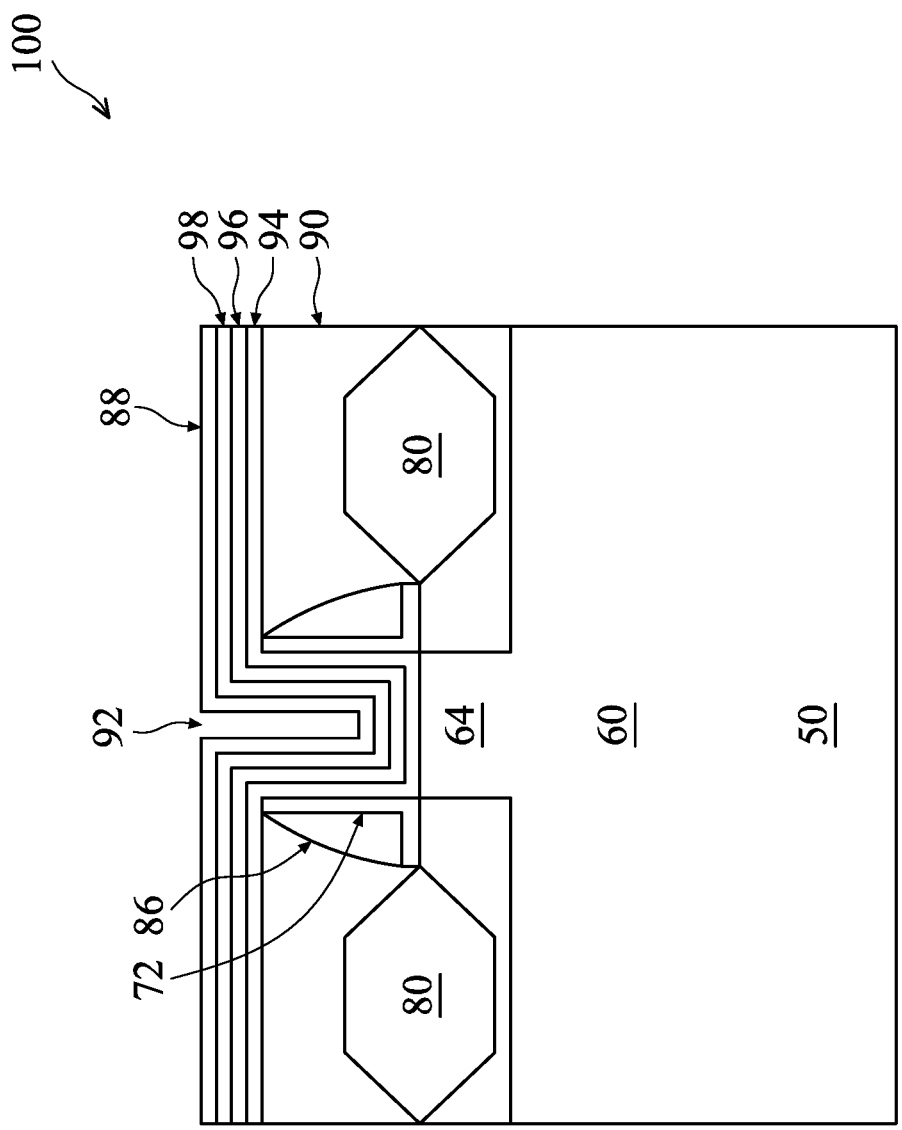
Figure 13:
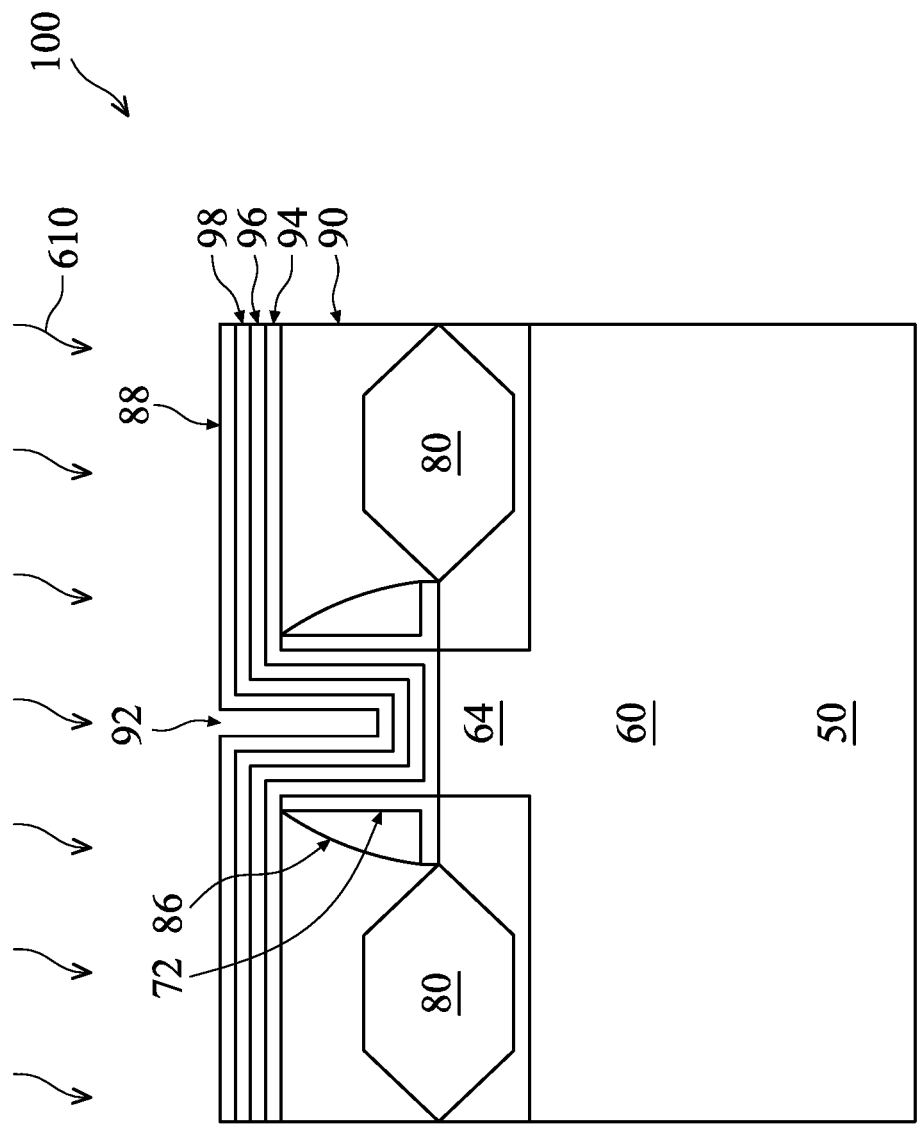

Next, as illustrated in FIGS. 10-11, the layer stack 121 is treated by a surface treatment process using a fluoride-containing chemical (may also be referred to as a fluoride-containing precursor) to dope the gate dielectric layer 94 with fluoride, and a thermal anneal process is subsequently performed to further increase the dopant (e.g., fluoride) concentration of the gate dielectric layer 94. In particular, FIG. 10 illustrates embodiments where the surface treatment process comprises a soak process, wherein the layer stack 121 is soaked in a precursor 84 which may be a fluoride-containing gas or a fluoride-containing plasma, and FIG. 11 illustrates the thermal anneal process performed after the soak process. FIGS. 12 and 13 illustrate an embodiment where the surface treatment process dopes the gate dielectric layer 94 by depositing a thin film 88 (see FIG. 12) over the layer stack 121 using a fluoride-containing precursor, and a thermal anneal process (see FIG. 13) further drives in the dopant (e.g., fluoride) into the gate dielectric layer 94. Details of the surface treatment process and the thermal anneal process are discussed hereinafter.

In accordance with some embodiments, the surface treatment process drives fluoride (e.g., fluoride radicals) from an upper surface of the layer stack 121 (e.g., an upper surface of the barrier layer 98) into the gate dielectric layer 94, effectively doping the gate dielectric layer 94 with fluoride and increasing a concentration of fluoride in the gate dielectric layer 94. Doping the gate dielectric layer 94 with fluoride improves the time-dependent dielectric breakdown (TDDB) performance of the FinFET device 100, in some embodiments.

Time-dependent dielectric breakdown (TDDB) is a failure mechanism in metal-oxide-semiconductor field-effect transistors (MOSFETs), where the gate oxide breaks down as a result of long-time application of relatively low electric field (as opposite to immediate breakdown, which is caused by strong electric field). The breakdown is caused by formation of a conducting path through the gate oxide to the substrate due to electron tunneling current, when MOSFETs are operated close to or beyond their specified operating voltages.

In accordance with some embodiments, the surface treatment process includes subjecting the layer stack 121 to a fluoride-containing chemical (e.g., chemical 84). A molecular composition of the chemical (e.g., chemical 84) may be represented as MF, where F stands for fluoride, M stands for another suitable element, and x represents the molecular ratio of F to M. In some embodiments, the element M is a metal, such as tungsten (W), molybdenum (Mo), titanium (Ti), iron (Fe), nickel (Ni), cobalt (Co), chromium (Cr), copper (Cu), aluminum (Al), manganese (Mn), silicon (Si), calcium (Ca), zirconium (Zr), niobium (Nb), hafnium (Hf), tantalum (Ta), lead (Pb), or the like. In other embodiments, the element M is a non-metal, such as N, C, S, Cl, or the like. Examples of the chemical 84 may include tungsten hexafluoride ($WF_6$), nitrogen trifluoride ($NF_3$), molybdenum hexafluoride ($MoF_6$), $FeF_2$, $FeF_3$, $NiF_2$, $CoF_2$, $CrF_2$, $CrF_3$, $CuF$, $MoF_3$, $TiF_3$, $TiF_4$, $AlF_3$, $SiF_4$, $MnF_2$, $ZrF_4$, $NbF_5$, $HfF_4$, $TaF_5$, NaF, KF, LiF, $MgF_2$, $CaF_2$, $BaF_2$, $ZnF_2$, $PbF_2$, $CF_4$, $C_2F_6$, $SF_6$, $C_3F_8$, $CHF_3$.

Referring now to FIG. 10, in some embodiments, the surface treatment process is a thermal process using a fluoride-containing gas as the chemical 84. For example, a $WF_6$ gas may be used as the chemical 84. The fluoride-containing gas 84 is supplied to be in contact with the surface of the barrier layer 98, as illustrated in FIG. 10. The fluoride-containing gas 84 may be carried by a carrier gas, which may be an inert gas such as N2, Ar, He, the like, or combinations thereof. The energy (e.g., thermal energy) of the thermal process breaks down the bond between F and element M (e.g., the bond between F and W where $WF_6$ is used as the chemical 84) and produces radicals of fluoride, in some embodiments. As an example, the breakdown of $WF_6$ may be described by the following chemical equation (1).

$$WF_6 \rightarrow W + 6F \qquad (1)$$

A layer (not shown) comprising element M (e.g., W) may form over the barrier layer 98 after the thermal process. The thermal process drives the radicals of fluoride into the layer stack 121 toward the gate dielectric layer 94. In some embodiments, the radicals of fluoride are driven into the gate dielectric layer 94 by the thermal process. The radicals of fluoride may compensate the trap state at an interface between the gate dielectric layer 94 and an adjacent dielectric layer (e.g., the first ILD 90 and/or the first gate spacer 72), thereby reducing the trap state density ($D_{it}$) at the interface.

Parameters of the surface treatment process, such as the temperature and/or the duration of the surface treatment process, flow rate of the chemical 84, may be adjusted to achieve a target concentration of fluoride in the gate dielectric layer 94. For example, a low (e.g., lower than 200° C.) temperature and/or a short duration (e.g., shorter than 30 seconds) may not drive enough fluoride into the gate dielectric layer 94 to achieve the target fluoride concentration. On the other hand, a high temperature (e.g., higher than 650° C.) and/or a long duration (e.g., longer than 30 seconds) may drive fluoride past the gate dielectric layer 94 and into the adjacent dielectric layer (e.g., the first ILD 90 or the first gate spacer 72).

In an exemplary embodiment, the thermal process is performed using a gas of $WF_6$ at a temperature between about 200° C. and about 650° C. A flow rate of $WF_6$ may be between about 5 standard cubic centimeter per minute (sccm) and about 10,000 sccm, such as 1000 sccm. A flow rate of the carrier gas may be between about 5 sccm to about 10,000 sccm, such as 6000 sccm. A pressure of the thermal process may be between about 0.5 torr and about 300 torr, such as 20 torr, and a duration of the thermal process may be between about 0.1 seconds to about 300 seconds, such as 100 seconds.

Still referring to FIG. 10, in some embodiments, the surface treatment process is a plasma process using a fluoride-containing plasma as the chemical 84. For example, a $NF_3$ gas may be activated into plasma and used as the chemical 84. The fluoride-containing plasma 84 may be carried by a carrier gas, which may be an inert gas such as $N_2$, Ar, He, the like, or combinations thereof. The fluoride-containing plasma 84 is supplied to be in contact with the surface of the barrier layer 98, as illustrated in FIG. 10. The energy of the plasma process (e.g., discharge energy) breaks down the bond between F and element M (e.g., F and N) and produces radicals of fluoride. For example, the $NF_3$ plasma bombards the surface of the barrier layer 98, thus breaking down the bond between F and N, and initiating a number of chemical reactions. The breakdown of the $NF_3$ plasma may be illustrated by the following chemical equations (2) and (3).

$$NF_3 \rightarrow NF^+ + 2F \qquad (2)$$

$$NF_3 \rightarrow NF_2^+ + F \qquad (3)$$

Element M (e.g., N) from the breakdown of the chemical 84 may form a byproduct(s) that may be evacuated (e.g., pumped out) from the deposition chamber (not shown) that the FinFET device 100 is in, or may form a layer (not shown) comprising element M over the carrier layer 98. The energy of the plasma process drives the radicals of fluoride into the layer stack 121 toward the gate dielectric layer 94. In some embodiments, the radicals of fluoride are driven into the gate dielectric layer 94 by the plasma process.

In an exemplary embodiment, the plasma process is performed using the plasma of an $NF_3$ gas at a temperature between about 20° C. and about 400° C. An energy of the plasma process is between about 5 volt to about 10,000 volt, such as 500 volt. A flow rate of $NF_3$ may be between about 10 sccm and about 5,000 sccm, such as 200 sccm. A flow rate of the carrier gas may be between about 5 sccm to about 10,000 sccm, such as 3000 sccm. A pressure of the plasma process may be between about 0.5 torr and about 300 torr, such as 15 torr, and a duration of the plasma process may be between about 0.1 second to about 300 seconds, such as 100 seconds.

Next, as illustrated in FIG. 11, after the surface treatment process (e.g., a thermal process or a plasma process), an optional thermal anneal process 510 may be performed to further drive fluoride (e.g., fluoride radicals in the capping layer 96 and in the barrier layer 98) contained in the layer stack 121 into the gate dielectric layer 94. In an exemplary embodiment, the thermal anneal process 510 is performed at a temperature between about 400° C. and about 700° C., such as 550° C., for a duration of between about 0.1 second to about 300 seconds, such as 30 seconds. A concentration of fluoride in the range between $1E15/cm^2$ and $1E17/cm^2$ is achieved after the thermal anneal process.

Referring now to FIGS. 12 and 13. FIGS. 12 and 13 illustrate another embodiment of the surface treatment process and a subsequent thermal anneal process, respectively. As illustrated in FIG. 12, the surface treatment process comprises forming a film 88 over the barrier layer 98 using a fluoride-containing precursor (not shown). For example, tungsten hexafluoride ($WF_6$) or molybdenum hexafluoride ($MoF_6$) may be used as the fluoride-containing precursor to form the film 88. Other fluoride-containing precursors that may be used to form the film 88 include $FeF_2$, $FeF_3$, $NiF_2$, $CoF_2$, $CrF_2$, $CrF_3$, $CuF$, $MoF_3$, $TiF_3$, $TiF_4$, $AlF_3$, $SiF_4$, $MnF_2$, $ZrF_4$, $NbF_5$, $HfF_4$, $TaF_5$, $NaF$, $KF$, $LiF$, $MgF_2$, $CaF_2$, $BaF_2$, $ZnF_2$, and $PbF_2$. The precursor may be carried by a carrier gas, which may be an inert gas such as $N_2$, Ar, He, the like, or combinations thereof. A suitable deposition method, such as ALD, PVD, CVD, the like, or combinations thereof, may be used to form the film 88.

In some embodiments, the fluoride-containing precursor (e.g., $WF_6$ or $MoF_6$) decomposes during the deposition process, thereby breaking the bond between F and the element M (e.g., W or Mo) of the precursor. The element M of the precursor after the decomposition of the precursor forms the film 88, and the fluoride after the decomposition is driven by the energy (e.g., thermal energy) of the deposition process into the layer stack 121 toward the gate dielectric layer 94. For example, the film 88 may comprise a layer of W or a layer of Mo, when $WF_6$ or $MoF_6$ are used as the precursor in the deposition process. The film 88 may also contain fluoride and small amount of undecomposed precursor. In some embodiments, fluoride is driven into the gate dielectric layer 94 during the deposition process.

In an exemplary embodiment, the surface treatment process comprises forming the film 88 using a fluoride-containing precursor at a temperature between about 200° C. and about 500° C., such as 350° C. A flow rate of the precursor may be between about 10 sccm and about 5,000 sccm, such as 500 sccm. A flow rate of the carrier gas may be between about 5 sccm to about 10,000 sccm, such as 3000 sccm. A pressure of the deposition process to form the film 88 may be between about 0.5 torr and about 300 torr, such as 20 torr. A thickness of the film 88 may be between about 3 Å and about 200 Å, such as 100 Å, although other dimensions are also possible.

Next, as illustrated in FIG. 13, after the surface treatment process of FIG. 12, an optional thermal anneal process 610 may be performed to further drive fluoride (e.g., fluoride radicals in the capping layer 96 and in the barrier layer 98) contained in the layer stack 121 into the gate dielectric layer 94. In an exemplary embodiment, the thermal anneal process 610 is performed at a temperature between about 400° C. and about 700° C., such as 550° C., for a duration of between about 0.1 second to about 300 seconds, such as 30 seconds. A concentration of fluoride in the range between $1E15/cm^2$ and $1E17/cm^2$ is achieved after the thermal anneal process.

As discussed above, the surface treatment process (e.g., the thermal process, the plasma process, or the film deposition process) may form a layer (not shown) comprising the element M (e.g., W, Mo) over the surface of the barrier layer 98. This layer of element M is removed by a suitable process such as etching before the recess 92 is filled, in some embodiments. In other embodiments, the layer comprising element M is not removed. Instead, it remains over the carrier layer 98 and is used as part of the work function layer to tune the threshold voltage $V_t$ of the FinFET device 100. For simplicity, the layer comprising element M (if not removed), is not shown in subsequent figures.

Embodiments of the surface treatment process have many advantages. As the size of semiconductor devices becomes increasing smaller in advanced processing node, the implantation angle available for the ion implantation process used to dope the gate dielectric layer of FinFET devices is limited due to, e.g., the close proximity of fins and/or gate structures. Therefore, ion implantation processes may not be able to dope certain areas of the gate dielectric layer to achieve the target dopant concentration. The present disclosure provides various non-destructive and effective methods to dope the gate dielectric layer. As a result, the time-dependent dielectric breakdown (TDDB) performance of the FinFET device 100 is improved. Processing steps used in the disclosed surface treatment process, such as the soak process, film deposition and etching, are mature processing steps in semiconductor manufacturing and are readily available. In addition, the raw materials used in the surface treatment process are low-cost materials, thus allowing for a low-cost surface treatment process. Furthermore, the disclosed surface treatment process can be easily integrated with the existing replacement gate process. For example, the presently disclosed surface treatment process causes no change in the metal gate film stack formed, thus ensuring good compatibility with existing process flow.

Figure 14:
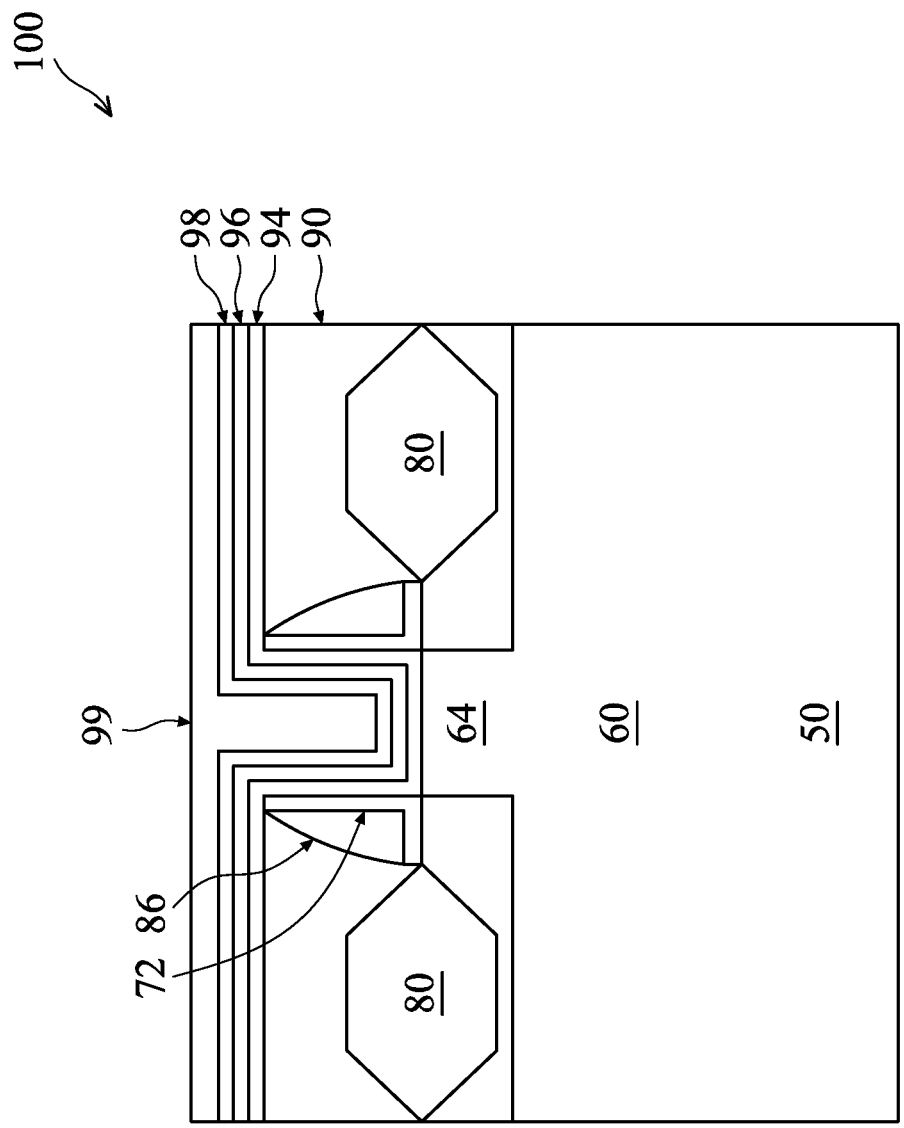

Next, as illustrated in FIGS. 14-20, processing continues after the surface treatment process shown in FIGS. 10-13. Referring to FIG. 14, a gate electrode 99 is deposited over the barrier layer 98, and fills the remaining portions of the recess 92. The gate electrode 99 may be made of a metal-containing material such as Cu, Al, W, the like, combinations thereof, or multi-layers thereof, and may be formed by, e.g., electroplating, electroless plating, PVD, CVD, or other suitable method.

Figure 15:
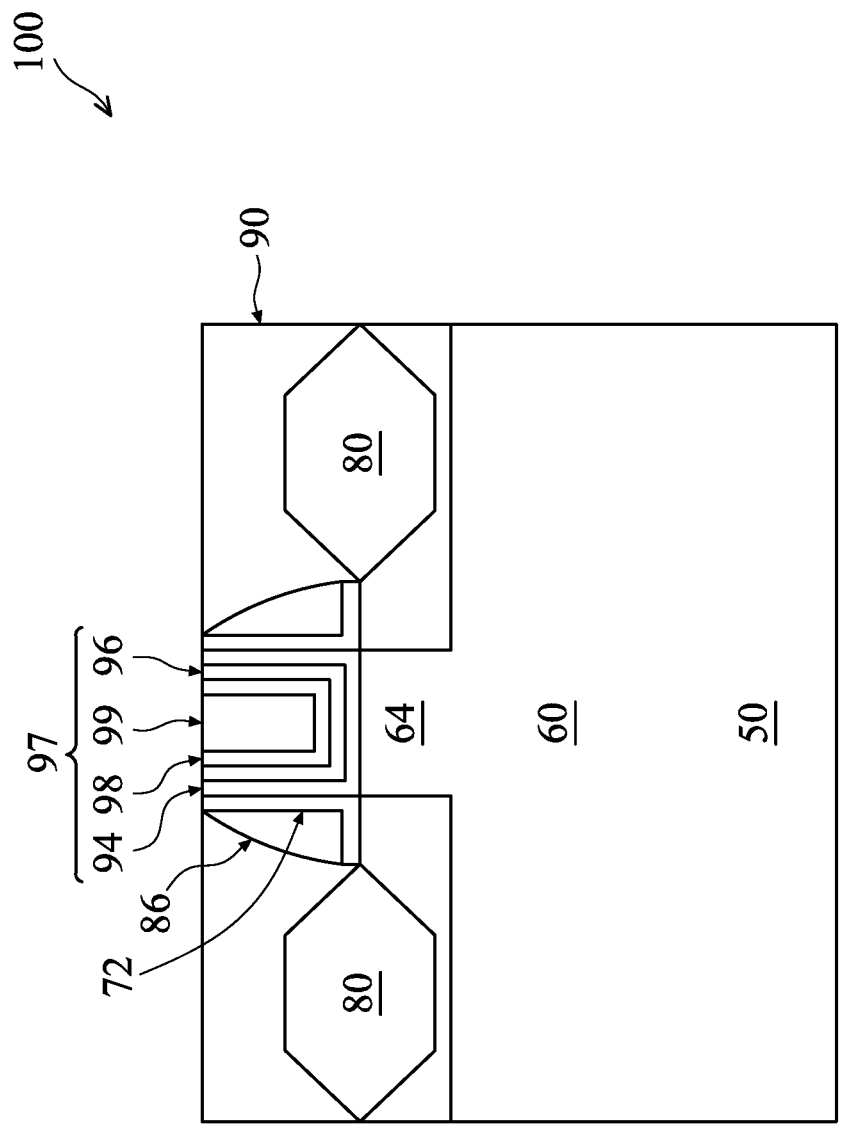

Next, as illustrated in FIG. 15, a planarization process, such as a CMP, may be performed to remove the excess portions of the gate dielectric layer 94, the capping layer 96, the barrier layer 98, and the material of the gate electrode 99, which excess portions are over the top surface of first ILD 90. The resulting remaining portions of material of the gate electrode 99, the barrier layer 98, the capping layer 96, and the gate dielectric layer 94 thus form a replacement gate 97 of the resulting FinFET device 100.

Figure 16:
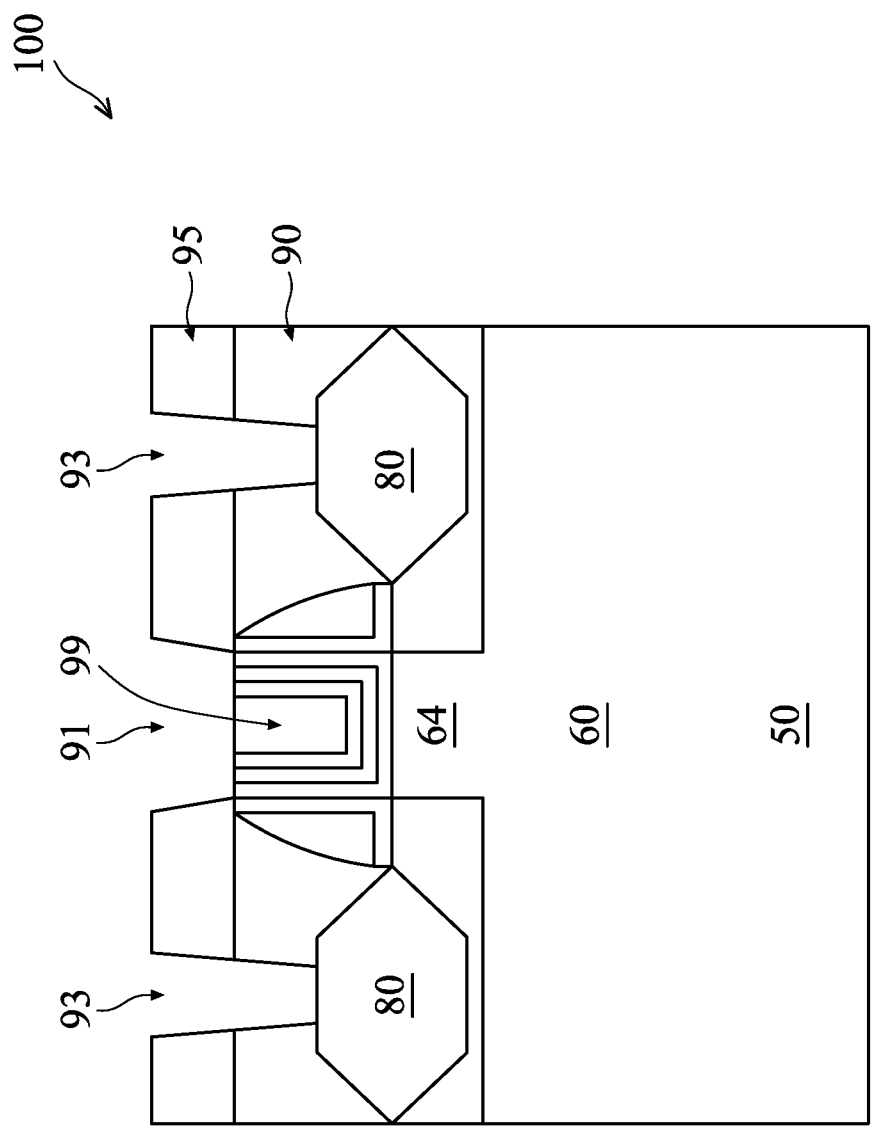

Next, in FIG. 16, a second ILD 95 is deposited over the first ILD 90. In an embodiment, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Contact openings 91 and 93 for contacts 102 (see FIG. 20) are formed through the first ILD 90 and/or the second ILD 95. For example, the contact opening 91 is formed through the second ILD 95 and exposes the replacement gate 97, while the contact openings 93 are formed through the first ILD 90 and the second ILD 95, and expose source/drain regions 80. The contact openings 91/93 are illustrated in a single cross-section as an example, the contact openings 91/93 could be in different cross-sections.

Figure 17:
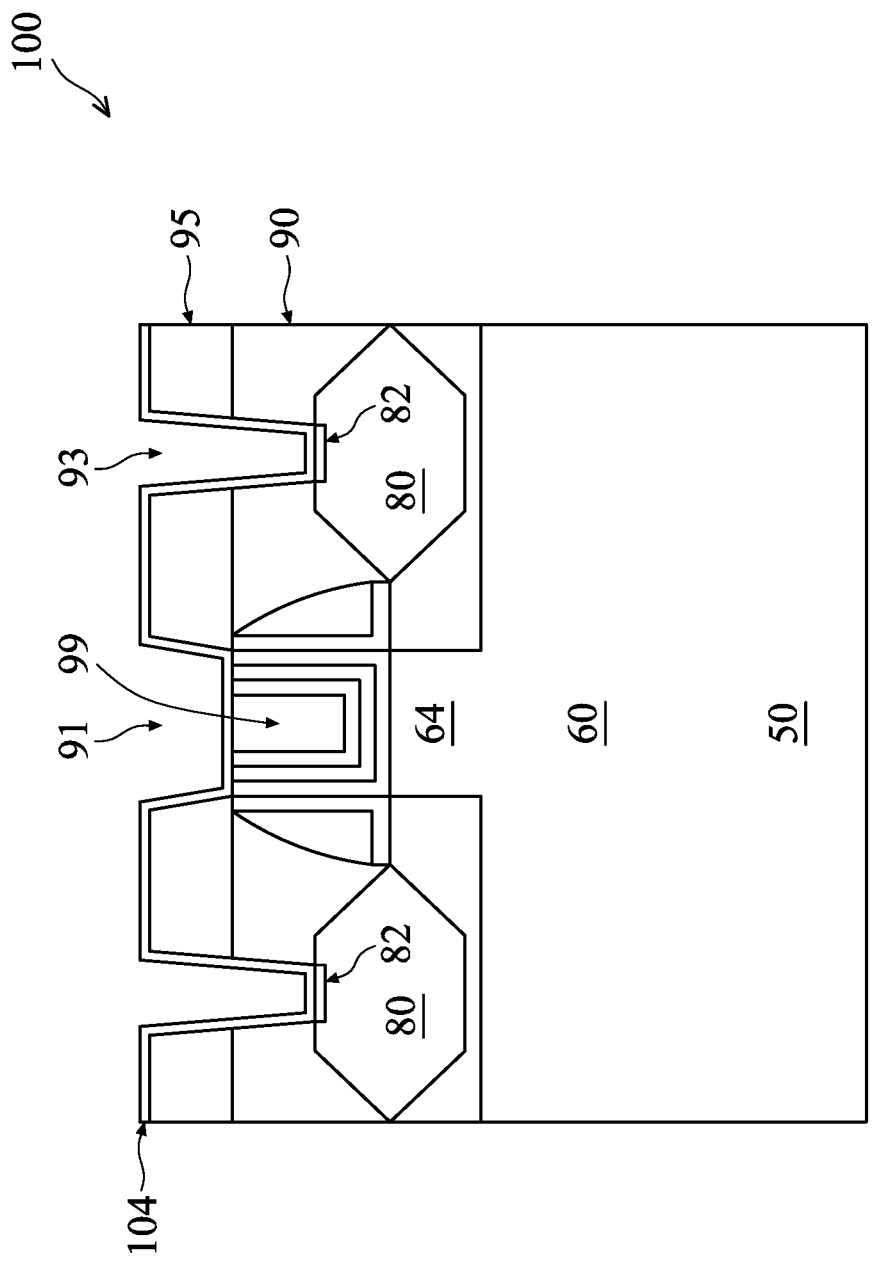

Next, in FIG. 17, a barrier layer 104 is formed over the second ILD 95. In some embodiments, the barrier layer 104 is conformally formed over the second ILD 95 and lines sidewalls and bottoms of the contact openings 91/93. The barrier layer 104 may comprise an electrically conductive material such as titanium (Ti), titanium nitride (TiN), tantalum (Ta), tantalum nitride (TaN), or the like, and may be formed using a CVD process, such as PECVD. However, other alternative processes, such as sputtering or MOCVD, PVD, ALD, may also be used.

In some embodiments, silicide regions 82 are formed over the epitaxial source/drain regions 80, e.g., between the epitaxial source/drain regions 80 and the barrier layer 104. The silicide regions 82 may be formed before the barrier layer 104 is formed, although the silicide regions 82 may also be formed during the process of forming the barrier layer 104. Silicide regions 82 may be formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the epitaxial source/drain regions 80, then performing a thermal anneal process to form the silicide regions 82. The un-reacted portions of the deposited metal are then removed, e.g., by an etching process. Although regions 82 are referred to as silicide regions, regions 82 may also be germanide regions, or silicon germanide regions (e.g., regions comprising silicide and germanide).

Figure 18:
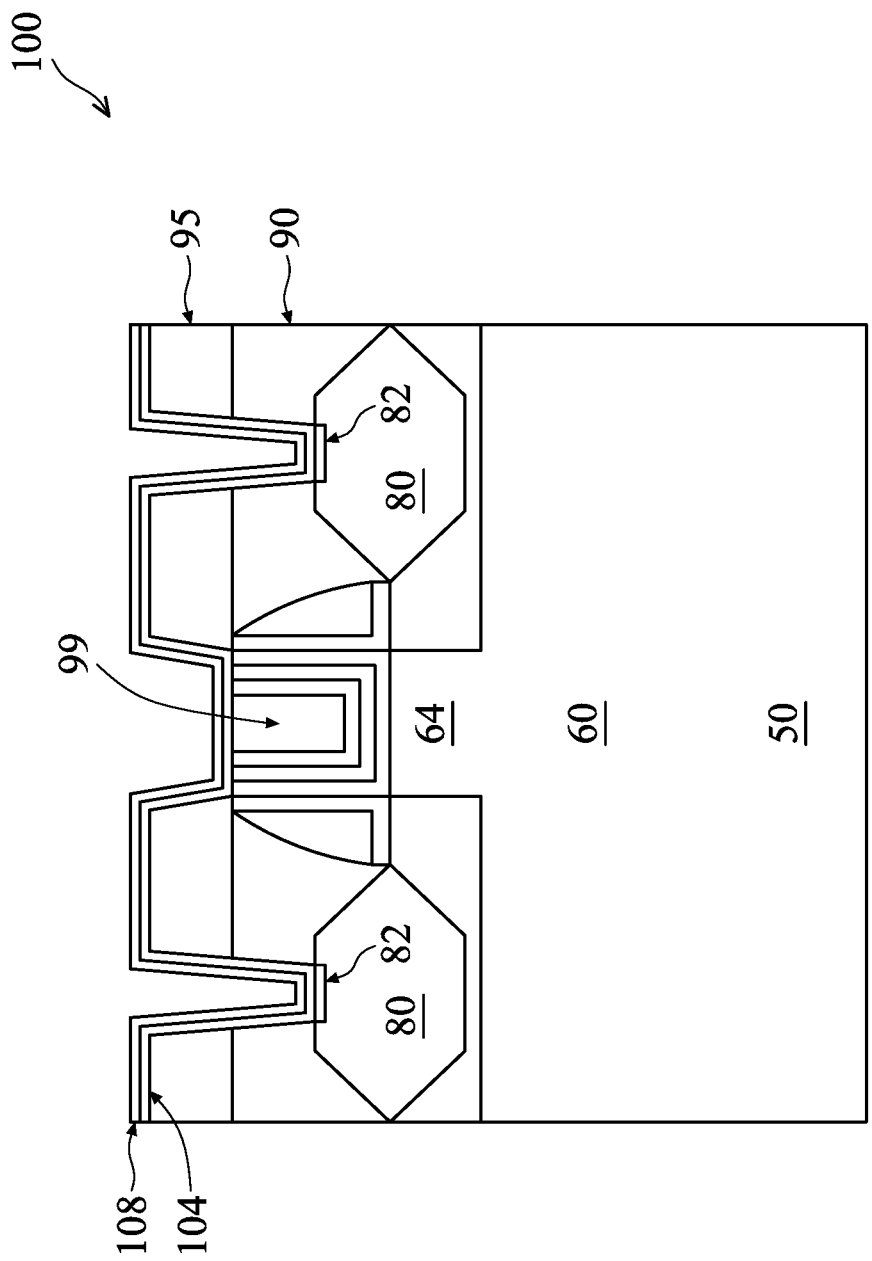

Next, as illustrated in FIG. 18, a seed layer 108 is formed over the barrier layer 104. The seed layer 108 may be deposited by PVD, ALD or CVD, and may be formed of tungsten, copper, or copper alloys, although other suitable methods and materials may alternatively be used.

Figure 19:
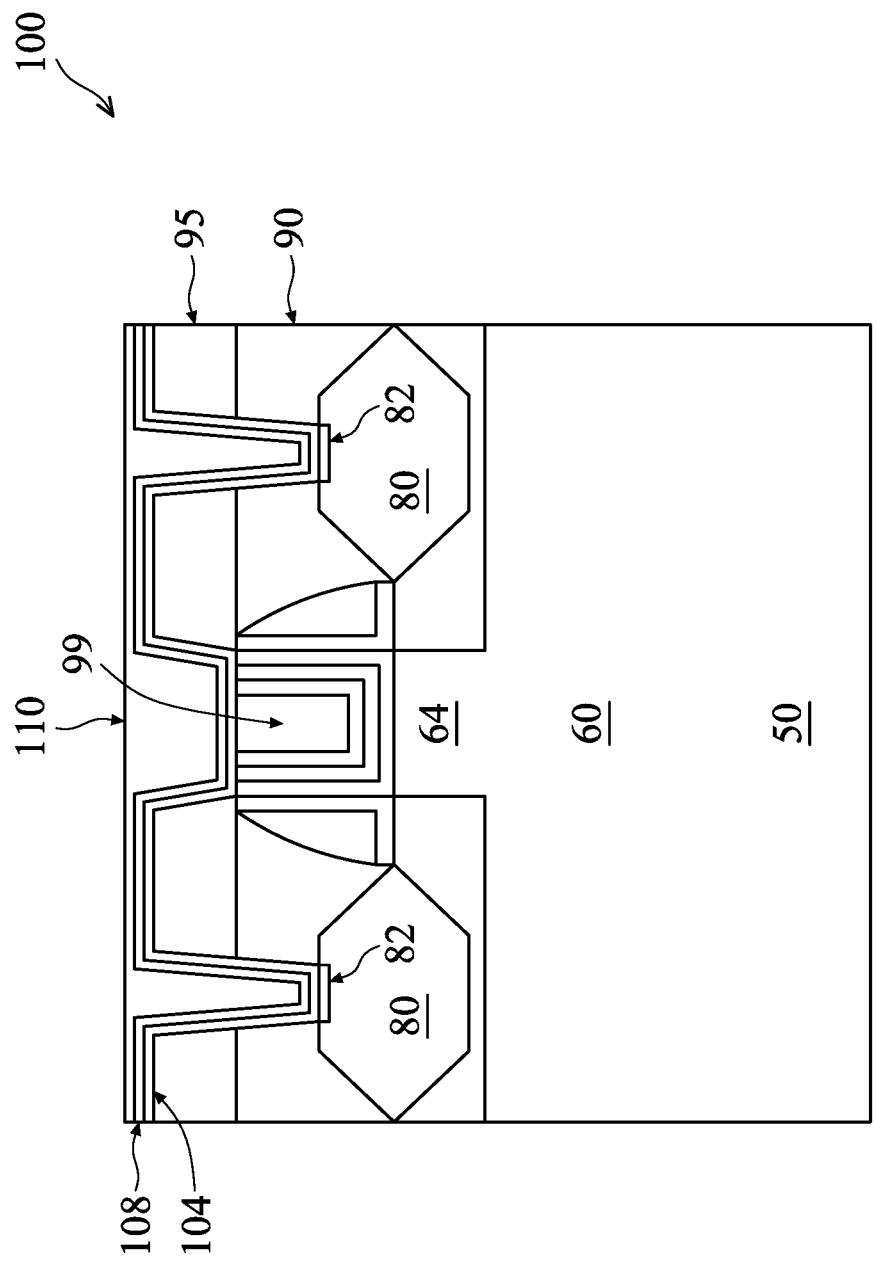

Once the seed layer 108 has been formed, the conductive material no may be formed onto the seed layer 108, filling and overfilling the contact openings 91/93, as illustrated in FIG. 19. The conductive material no may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Figure 20:
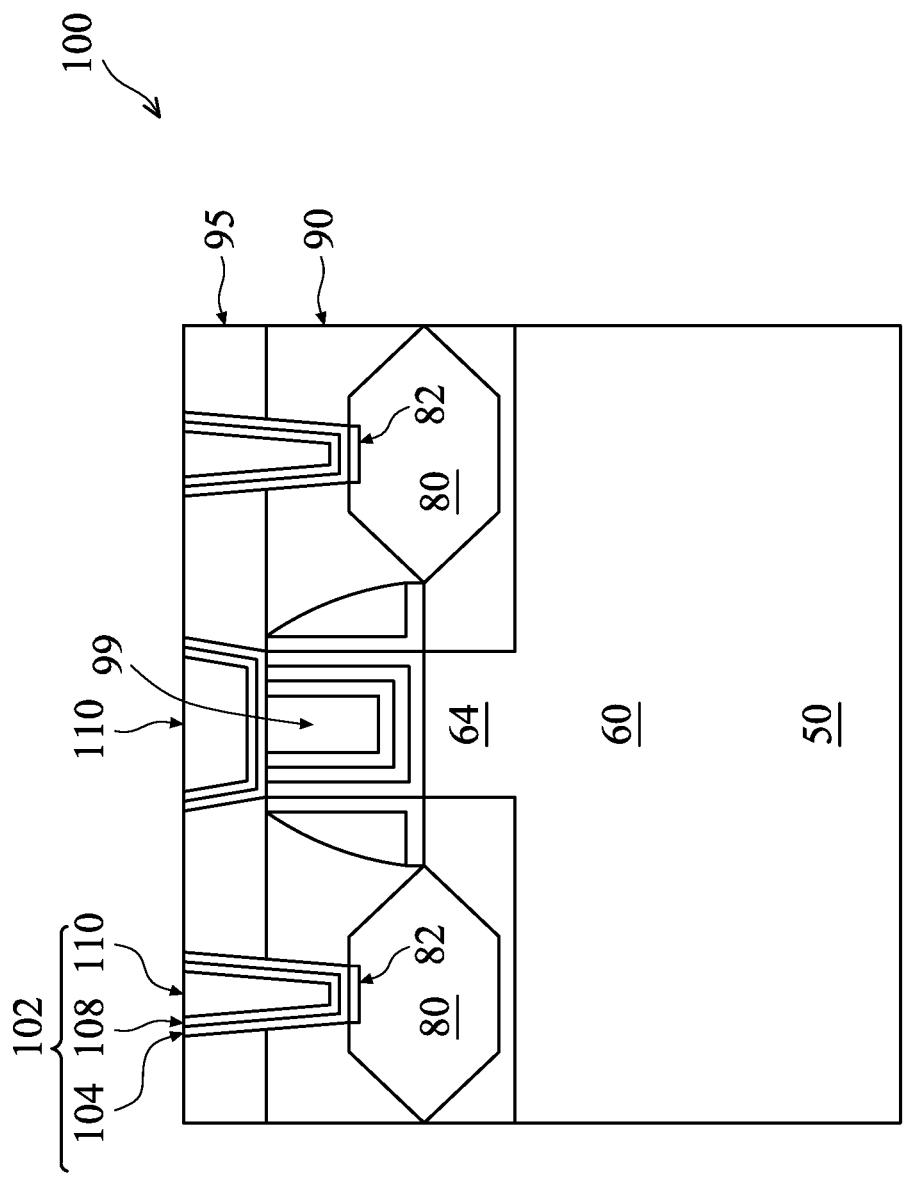

Referring to FIG. 20, once the contact openings 91/93 have been filled, excess barrier layer 104, seed layer 108, and conductive material 110 outside of the contact openings 91/93 may be removed through a planarization process such as CMP, although any suitable removal process may be used. Contact plugs 102 are thus formed in the contact openings 91/93.

Variations and modifications of the presently disclosed embodiments are possible. For example, various embodiments of the surface treatment process discussed above may be combined to further improve the fluoride concentration in the gate dielectric layer 94. As an example, the soak process using a fluoride-containing gas (e.g., $WF_6$) discussed above with reference to FIG. 10 may be performed, followed by the film deposition process discussed above with reference to FIG. 12, then a thermal anneal process as discussed in FIG. 13 may be performed to further drive the fluoride into the gate dielectric layer 94. Other variations are possible. For example, the processing illustrated in FIGS. 10-11 may be performed, then the processing illustrated in FIGS. 12-13 may be performed next. Therefore, FIGS. 10-14 may illustrate another embodiment of the surface treatment process. Embodiments of the present disclosure are discussed using fluoride as the dopant for the gate dielectric layer 94. In embodiments where elements other than fluoride are used as the dopants to improve the TDDB performance of the gate dielectric layer 94, the surface treatment process may be modified to use chemicals or precursors that contain the dopant other than fluoride. These and other modifications to the present disclosure are possible, and are fully intended to be included within the scope of the present disclosure.

Figure 21:
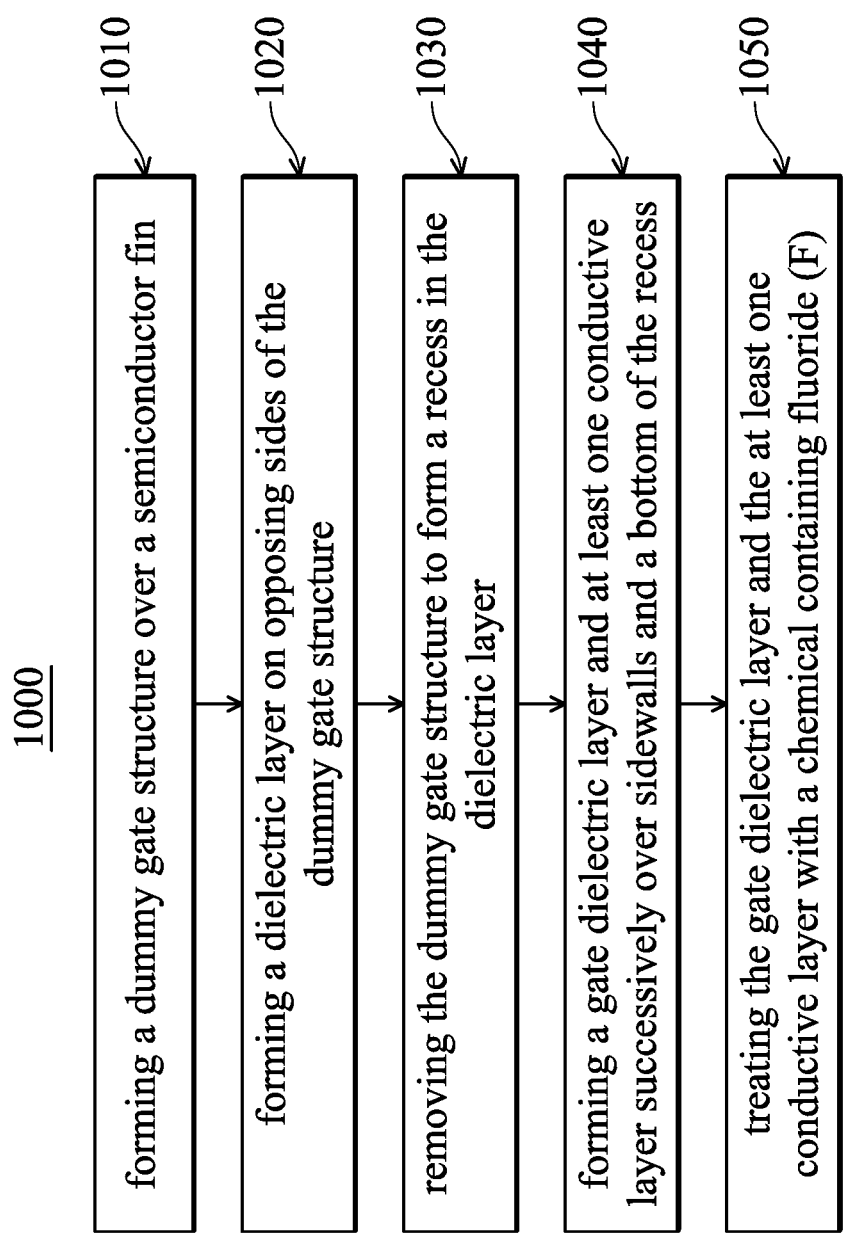
FIG. 21 illustrates a flow chart of a method of fabricating a semiconductor device, in accordance with some embodiments.

FIG. 21 illustrates a flow chart of a method of fabricating a semiconductor device, in accordance with some embodiments. It should be understood that the embodiment method shown in FIG. 21 is merely an example of many possible embodiment methods. One of ordinary skill in the art would recognize many variations, alternatives, and modifications. For example, various steps as illustrated in FIG. 21 may be added, removed, replaced, rearranged and repeated.

Referring to FIG. 21, at step 1010, a dummy gate structure is formed over a semiconductor fin. At step 1020, a dielectric layer is formed on opposing sides of the dummy gate structure. At step 1030, the dummy gate structure is removed to form a recess in a dielectric layer. At step 1040, a gate dielectric layer and at least one conductive layer are successively formed over sidewalls and a bottom of the recess. At step 1050, the gate dielectric layer and the at least one conductive layer are treated with a chemical containing fluoride (F).

Embodiments may achieve advantages. The surface treatment process disclosed in the present disclosure provides various non-destructive and effective methods to dope the gate dielectric layer. The TDDB performance of the semiconductor device is improved as a result. Processing steps used in the disclosed surface treatment process, such as the soak process, film deposition and etching, are mature semiconductor processing steps and readily available. The raw materials used in the surface treatment process are low-cost materials. Furthermore, the disclosed surface treatment process can be easily integrated with the existing replacement gate process. For example, there is no change in the metal gate film stack formed using the presently disclosed methods, thus ensuring good compatibility with existing process flow.

In some embodiments, a method includes forming a dummy gate structure over a semiconductor fin, forming a dielectric layer on opposing sides of the dummy gate structure, and removing the dummy gate structure to form a recess in the dielectric layer. The method further includes forming a gate dielectric layer and at least one conductive layer successively over sidewalls and a bottom of the recess, and treating the gate dielectric layer and the at least one conductive layer with a chemical containing fluoride (F).

In some embodiments, a method of forming a Fin Field-Effect Transistor (FinFET) includes providing a substrate with a fin protruding above upper surfaces of isolation structures disposed on opposing sides of the fin, forming a first gate structure over the fin, forming an inter-layer dielectric (ILD) layer around the first gate structure, the ILD layer exposing an upper surface of the first gate structure, and removing the first gate structure to form a recess in the ILD layer. The method also includes forming a layer stack in the recess, where the forming the layer stack includes conformally forming a high-K dielectric layer in the recess, conformally forming a conductive capping layer over the high-K dielectric layer, and conformally forming a conductive barrier layer over the conductive capping layer. The method further includes performing a surface treatment process for the layer stack using a chemical comprising fluoride, where the surface treatment process drives fluoride into the high-K dielectric layer, and performing a thermal anneal process after the surface treatment process.

In some embodiments, a method includes forming a dielectric layer, covering the dielectric layer with at least one conductive layer, supplying a fluoride-containing precursor over the at least one conductive layer, and driving fluoride of the fluoride-containing precursor into the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method comprising:
    surrounding a dummy gate structure with a dielectric layer;
    removing the dummy gate structure to form a recess in the dielectric layer;
    forming a gate dielectric layer and at least one conductive layer successively over sidewalls and a bottom of the recess; and
    performing a surface treatment process to the gate dielectric layer and the at least one conductive layer, wherein performing the surface treatment process comprises:
        supplying a fluoride-containing precursor to the at least one conductive layer, wherein supplying the fluoride-containing precursor forms a film over the at least one conductive layer; and
        driving fluoride from the fluoride-containing precursor into the gate dielectric layer.

2. The method of claim 1, wherein supplying the fluoride-containing precursor comprises supplying a fluoride-containing gas to a surface of the at least one conductive layer.

3. The method of claim 2, where the fluoride-containing gas comprises tungsten hexafluoride ($WF_6$) or molybdenum hexafluoride ($MoF_6$).

4. The method of claim 1, wherein supplying the fluoride-containing precursor comprises supplying a fluoride-containing plasma to the at least one conductive layer.

5. The method of claim 4, wherein the fluoride-containing plasma comprises a plasma of nitrogen trifluoride ($NF_3$).

6. The method of claim 1, wherein supplying the fluoride-containing precursor and driving the fluoride are performed at a same time.

7. The method of claim 6, further comprising, after performing the surface treatment process, performing a thermal anneal process.

8. The method of claim 1, wherein after the surface treatment process, a concentration of fluoride in the gate dielectric layer is in a range between about $1E15/cm^2$ and about $1E17/cm^2$.

9. The method of claim 1, further comprising filling the recess using a conductive material after performing the surface treatment process.

10. The method of claim 1, wherein the forming the gate dielectric layer and the at least one conductive layer comprises:
    forming the gate dielectric layer over the sidewalls and the bottom of the recess;
    forming a capping layer over the gate dielectric layer, the capping layer comprising a first conductive material; and
    forming a barrier layer over the capping layer, the barrier layer comprising a second conductive material different from the first conductive material.

11. The method of claim 10, wherein the capping layer is formed using titanium nitride (TiN), and the barrier layer is formed using tantalum nitride (TaN).

12. A method of forming a Fin Field-Effect Transistor (FinFET) comprising:
    forming a gate structure over a fin that protrudes above a substrate;
    forming an inter-layer dielectric (ILD) layer around the gate structure;
    removing the gate structure to form a recess in the ILD layer;
    forming a layer stack in the recess, wherein the forming the layer stack comprises:
        lining sidewalls and a bottom of the recess with a gate dielectric layer; and
        forming a barrier layer over the gate dielectric layer; and
    treating the layer stack using a fluoride-containing chemical to increase a concentration of fluoride in the gate dielectric layer, wherein treating the layer stack comprises:
        soaking the layer stack in a fluoride-containing gas or a fluoride-containing plasma; and
        forming a film over the barrier layer after the soaking.

13. The method of claim 12, wherein forming the layer stack further comprises forming a capping layer between the gate dielectric layer and the barrier layer, wherein the capping layer is formed using a first electrically conductive material different from a second electrically conductive material of the barrier layer.

14. The method of claim 12, further comprising performing a thermal anneal process after treating the layer stack.

15. The method of claim 12, further comprising:
    removing the film after treating the layer stack; and
    filling the recess with an electrically conductive material.

16. The method of claim 12, further comprising, after treating the layer stack, forming an electrically conductive material on the film to fill the recess.

17. A semiconductor device comprising:
    a fin protruding above a substrate;
    a gate structure over the fin, the gate structure comprising:
        a gate dielectric layer comprising fluoride, wherein a concentration of fluoride in the gate dielectric layer is between about $1E15/cm^2$ and about $1E17/cm^2$;
        a work function layer over the gate dielectric layer;
        a barrier layer over the work function layer; and
        a gate electrode over the barrier layer; and
    source/drain regions over the fin and on opposing sides of the gate structure.

18. The semiconductor device of claim 17, further comprising a fluoride-containing film between the barrier layer and the gate electrode.

19. The semiconductor device of claim 18, wherein the work function layer comprises titanium nitride, and the barrier layer comprises tantalum nitride.

20. The semiconductor device of claim 17, wherein the gate dielectric layer comprises a high-K dielectric material.

* * * * *